United States Patent
Santurkar et al.

(10) Patent No.: US 9,509,307 B1
(45) Date of Patent: Nov. 29, 2016

(54) INTERCONNECT MULTIPLEXERS AND METHODS OF REDUCING CONTENTION CURRENTS IN AN INTERCONNECT MULTIPLEXER

(71) Applicant: Xilinx, Inc., San Jose, CA (US)

(72) Inventors: Vikram Santurkar, Bengaluru (IN); Anil Kumar Kandala, Hyderabad (IN); Santosh Yachareni, Hyderabad (IN); Shidong Zhou, Milpitas, CA (US); Robert Fu, Saratoga, CA (US); Philip Costello, Saratoga, CA (US); Sandeep Vundavalli, Secunderabad (IN); Steven P. Young, Boulder, CO (US); Brian C. Gaide, Erie, CO (US)

(73) Assignee: XILINX, INC., San Jose, CA (US)

( * ) Notice: Subject to any disclaimer, the term of this patent is extended or adjusted under 35 U.S.C. 154(b) by 285 days.

(21) Appl. No.: 14/492,370

(22) Filed: Sep. 22, 2014

(51) Int. Cl.
*H03K 19/003* (2006.01)
*H03K 19/173* (2006.01)
*H03K 19/00* (2006.01)
*G11C 7/12* (2006.01)

(52) U.S. Cl.
CPC ............. *H03K 19/003* (2013.01); *G11C 7/12* (2013.01); *H03K 19/0008* (2013.01); *H03K 19/1737* (2013.01)

(58) Field of Classification Search
CPC ............. H03K 19/17736; H03K 19/17728; H03K 19/17796; H03K 17/002; H03K 19/1776; H03K 19/1733; H03K 19/1737; H03K 19/177; H03K 19/17704
USPC ................................................. 326/37–41, 47
See application file for complete search history.

(56) References Cited

U.S. PATENT DOCUMENTS

| | | | |
|---|---|---|---|
| 6,014,038 A * | 1/2000 | How et al. ...................... | 326/46 |
| 6,529,040 B1 * | 3/2003 | Carberry et al. ............... | 326/40 |
| 7,061,271 B1 * | 6/2006 | Young et al. ................... | 326/46 |
| 7,236,026 B1 | 6/2007 | Samad et al. | |
| 7,385,416 B1 * | 6/2008 | Chirania et al. ................ | 326/38 |
| RE40,423 E * | 7/2008 | Nance et al. ............ | 365/189.02 |
| 7,471,104 B1 * | 12/2008 | Chirania ......................... | 326/38 |
| 7,759,974 B1 * | 7/2010 | Young ............................. | 326/41 |
| 8,077,219 B2 | 12/2011 | Delva et al. | |
| 2008/0197879 A1 * | 8/2008 | Leung ............................. | 326/44 |
| 2008/0265937 A1 * | 10/2008 | Sima et al. ..................... | 326/41 |
| 2009/0015308 A1 * | 1/2009 | Fung et al. .................... | 327/261 |

* cited by examiner

*Primary Examiner* — Jany Richardson
(74) *Attorney, Agent, or Firm* — John J. King

(57) ABSTRACT

An interconnect multiplexer comprises a plurality of CMOS pass gates of a first multiplexer stage coupled to receive data to be output by the interconnect multiplexer; an output inverter coupled to the outputs of the plurality of CMOS pass gates, wherein an output of the output inverter is an output of the interconnect multiplexer; and a plurality of memory elements coupled to the plurality of CMOS pass gates; wherein inputs to the plurality of CMOS pass gates are pulled to a common potential during a startup mode. A method of reducing contention currents in an integrated circuit is also disclosed.

14 Claims, 8 Drawing Sheets

INTERCONNECT MULTIPLEXERS AND METHODS OF REDUCING CONTENTION CURRENTS IN AN INTERCONNECT MULTIPLEXER

TECHNICAL FIELD

The present invention relates generally to integrated circuit devices, and in particular, to interconnect multiplexers and methods of reducing contention currents in an interconnect multiplexer.

BACKGROUND

In devices having programmable resources, interconnect multiplexers are implemented to enable the connection of various circuits in an integrated circuit device. Conventional interconnect multiplexers implement N-type metal oxide semiconductor (NMOS) pass-gates that are controlled by single ended outputs of configuration memory cells. An on-chip power supply to memory cells is pulled to ground during start-up to avoid any current contentions in the circuit. This would ensure that memory cells would switch off all NMOS transistors in multiplexers during power-up. A P-type metal oxide semiconductor (PMOS) transistor at the multiplexer output would initialize an input to a first inverter to a "HIGH" state, and a half-latch on the first inverter would retain this state and drive a "HIGH" on the final output inverter.

However, conventional circuits reducing or preventing current contention will not work for pass-gates having PMOS transistors. That is, the powering down of the on-chip memory cell power supply to ground will not ensure that outputs of memory cells are at logic "LOW" state. Rather, they may be stuck at a threshold voltage above ground, and would require a half-latch, which will impact the signal rise time at the input to the first inverter and therefore affect performance. Further, the write margin into the half-latch impacts the yield because of write margins that vary due to process corner variations. It is desirable to provide multiplexers that minimize contention in an integrated circuit.

SUMMARY

An interconnect multiplexer comprises a plurality of CMOS pass gates of a first multiplexer stage coupled to receive data to be output by the interconnect multiplexer; an output inverter having an input coupled to the outputs of the plurality of CMOS pass gates, wherein an output of the output inverter is an output of the interconnect multiplexer; and a plurality of memory elements coupled to the plurality of CMOS pass gates; wherein inputs to the plurality of CMOS pass gates are pulled to a common potential during a startup mode.

According to another implementation, an interconnect multiplexer comprises a plurality of multiplexer stages; a plurality of CMOS pass gates of a first multiplexer stage of the plurality of multiplexer stages coupled to receive a corresponding plurality of inputs; a first output inverter having an input coupled to outputs of the plurality of CMOS pass gates of the first multiplexer stage; and a control circuit coupled to a node at an input of the first output inverter of the first multiplexer stage, wherein the node is pulled to a predetermined potential during a startup mode.

A method of reducing contention currents in an interconnect multiplexer of an integrated circuit is also described. The method comprises implementing a plurality of CMOS pass gates of a first multiplexer stage to output data; coupling an input of an output inverter to the outputs of the plurality of CMOS pass gates; coupling a plurality of memory elements to the plurality of CMOS pass gates; and pulling inputs to the plurality of CMOS pass gates to a common potential during a startup mode.

Figure 1:
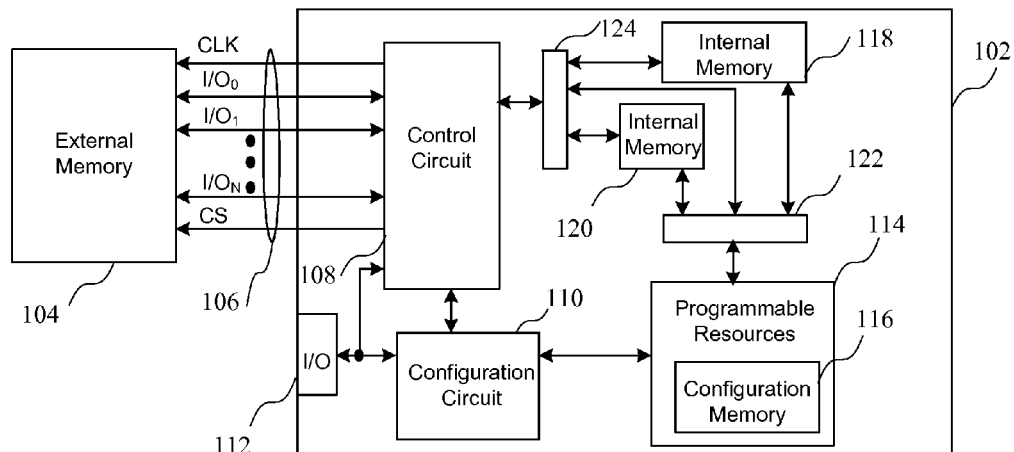
FIG. 1 is a block diagram of an integrated circuit coupled to an external memory.

Other features will be recognized from consideration of the Detailed Description and Claims, which follow.

DETAILED DESCRIPTION

While the specification includes claims defining the features of one or more implementations of the invention that are regarded as novel, it is believed that the circuits and methods will be better understood from a consideration of the description in conjunction with the drawings. While various circuits and methods are disclosed, it is to be understood that the circuits and methods are merely exemplary of the inventive arrangements, which can be embodied in various forms. Therefore, specific structural and functional details disclosed within this specification are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the circuits and methods.

In circuits having programmable resources, interconnect multiplexers are built out of CMOS pass-gates, which are controlled at gate terminals of NMOS and PMOS devices by complementary outputs of configuration memory cells. It is necessary that these memory cells power-up to a predictable state so that both inputs and outputs of multiplexers are at the same voltage state, thus reducing or preventing contention currents in the interconnect multiplexers. Upon power-up of the integrated circuit, complimentary outputs of all memory cells are forced to a logic LOW state, the last stage interconnect inverter input is forced to a logic LOW state, and inputs of all interconnect multiplexers are forced to a logic HIGH state. This advantageously ensures that interconnect multiplexor inputs and outputs are in the same voltage state, and therefore reduces or prevents contention currents upon power-up. Note that the terms "reducing" and "preventing" as used herein are not intended to be mutually exclusive. For example, contention currents may be reduced to the point where they are completely prevented.

An interconnect multiplexer that reduces contention currents in an integrated circuit includes a plurality of CMOS pass gates of a first multiplexer stage coupled to receive data to be output by the interconnect multiplexer and an output inverter of a multiplexer stage; wherein inputs to the plurality of CMOS pass gates are pulled to a common potential during a startup mode. The inputs to the plurality of CMOS pass gates may be pulled to a common potential during a startup mode by pulling inputs of output inverters to a common potential for example, where the outputs of the output inverters are coupled to inputs of CMOS pass gates. The memory elements controlling the CMOS pass gates are also controlled to ensure that both transistors of the CMOS pass gates are turned off at the appropriate time.

Turning first to FIG. 1, a block diagram of an integrated circuit coupled to an external memory. In particular, an integrated circuit device 102 is coupled to an external memory 104 by way of communication links 106. The integrated circuit device could be any type of integrated circuit device, such as an application specific integrated circuit (ASIC) or an integrated circuit device having programmable resources, as will be described in more detail below. The integrated circuit device 102 comprises a control circuit 108 coupled to a configuration circuit 110. The configuration circuit 110 may receive configuration data from the external memory 104 by way of the control circuit 108, or by way of an input/output (I/O) port 112. The configuration circuit 110 is used to configure the programmable resources 114 of the integrated circuit device by providing configuration data to the configuration memory 116. Alternatively, the configuration data could be provided to the configuration memory directly by the control circuit 108. The control circuit 108 and the programmable resources 114 may also be coupled to internal memory 118 and 120. Further, the integrated circuit device may optionally include dedicated interconnect elements 122 and 124, separate from interconnect elements associated with the programmable resources 114, for enabling access to the memory elements.

Figure 2:
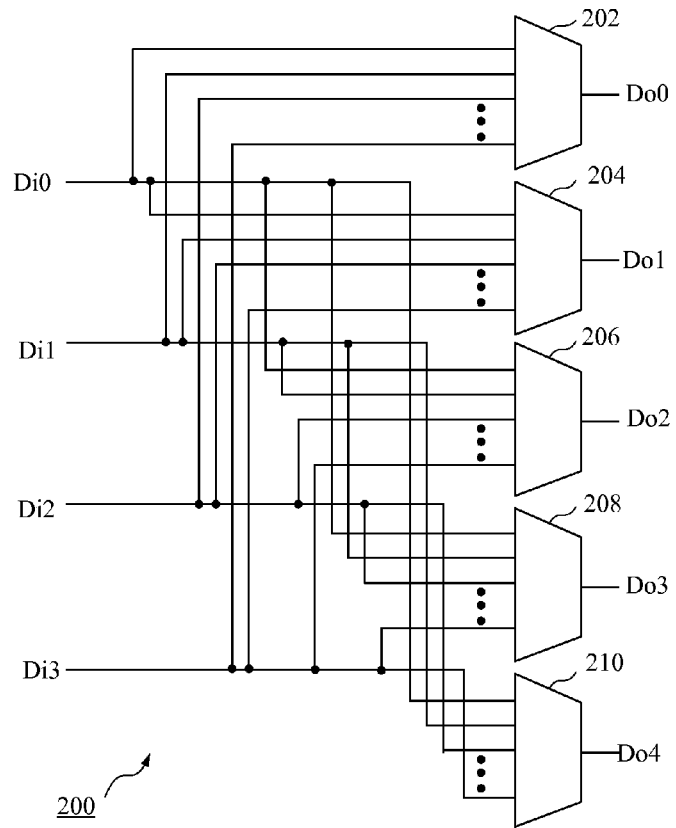
FIG. 2 is a block diagram of an interconnect multiplexer.

Turning now to FIG. 2, a block diagram of an interconnect multiplexer 200 is shown. In particular, each multiplexer of a plurality of multiplexers 202-210 is coupled to receive each of the inputs, designated Di0-Di3, and generate an output for each of the multiplexers. Multiplexer 202 generates an output Do0, multiplexer 204 generates an output Do1, multiplexer 206 generates an output Do2, multiplexer 208 generates an output Do3, and multiplexer 210 generates an output Do4 based upon selection signals provided to the plurality of multiplexers. While the multiplexer arrangement of FIG. 2 is shown by way of example, it should be understood that other arrangements of elements could be implemented to achieve the multiplexing functionality. The interconnect multiplexer 200 could be used at any location with the integrated circuit of FIG. 1, or the integrated circuit of FIG. 9, which will be described in more detail below.

In device having programmable resources, such as a field programmable gate array (FPGA) that will be described in more detail below in reference to FIGS. 9 and 10, interconnect multiplexers may be built out of CMOS pass-gates, which are controlled (at the gate terminals of NMOS and PMOS transistors) by complementary outputs of configuration memory cells. These memory cells need to power-up to a predictable state so that both inputs and outputs of multiplexers are at the same voltage state, thus reducing or preventing contention currents in the FPGA interconnect fabric. If the contention conditions are not resolved, the chip may not power-up and large currents may flow from power supply to ground nodes in the chip.

Common sources of contention when the memory cells power-up in unpredictable states include floating multiplexer outputs when all input switches (i.e., pass gates) are "OFF," and different logic levels at inputs if multiple random switches of a multiplexer are "ON". According to the various methods and circuits described below, contention is minimized in the interconnect multiplexers by forcing complimentary outputs of all memory cells to logic LOW state upon chip power-up, forcing the last stage interconnect inverter input to a logic LOW state, and forcing inputs of all interconnect multiplexers to a logic HIGH state. Because during power-up the on-chip regulated memory cell VDD supply (VGG) is at a ground (GND) state, it is necessary to drive both outputs of the memory cell to "LOW" state. Complementary outputs of memory cell may be forced to a logic LOW for predictable state in all memory cells, enabling controlling inputs of the multiplexer using global signals that will place the CMOS interconnect in a predictable intended state and avoid any contention currents.

Figure 3:
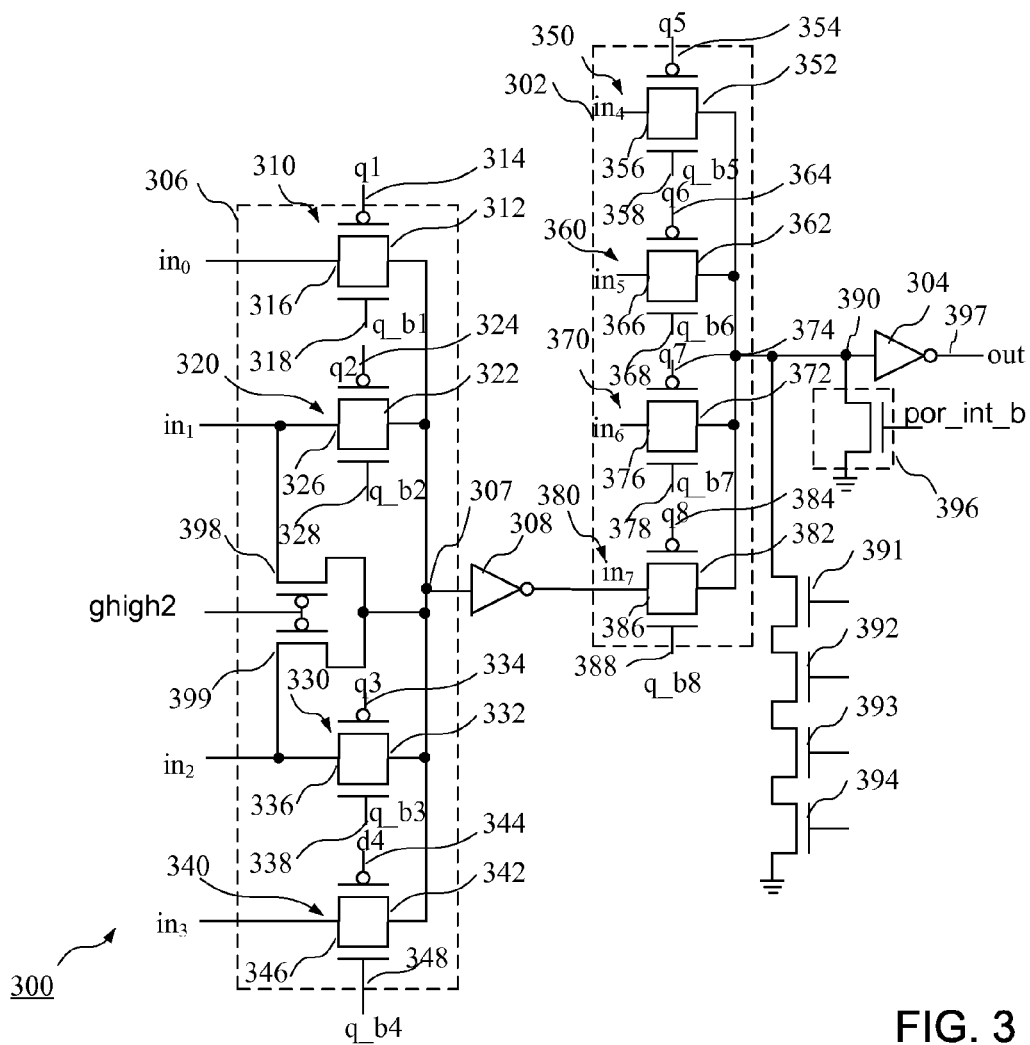
FIG. 3 is a circuit diagram of 2 multiplexer stages of an interconnect multiplexer.

Turning now to FIG. 3, a circuit diagram of two multiplexer stages of an interconnect multiplexer is shown. The multiplexer circuit 300 of FIG. 3, which could implemented as any of the multiplexers 202-210, comprises a first multiplexer stage 302 coupled to a first inverter 304 and a second multiplexer stage 306 coupled to an input 307 of a second inverter 308. The second multiplexer stage 306 is coupled to an output of an inverter of another stage to receive one of a plurality of input signals (designated $in_0$-$in_3$) to be generated as an output signal (out). More particularly, the multiplexer stage 306 comprises complementary metal oxide semiconductor (CMOS) gates comprising the source of a P-channel transistor coupled to the drain of the N-channel transistor and the drain of the P-channel transistor coupled to the source of the N-channel transistor, where the gates of the P-channel transistors are controlled by data values (shown here as $q_1$-$q_3$) and gates of the N-channel transistors are controlled by inverted data values (shown here as q1_b-q3_b). A first CMOS pair 310 has a PMOS transistor 312 coupled to receive a control signal q1 at its gate 314, and a NMOS transistor 316 coupled to receive the inverted control signal q1_b at its gate 318. A second CMOS pair 320 has a PMOS transistor 322 coupled to receive a control signal q2 at its gate 324, and a NMOS transistor 326 coupled to receive the inverted control signal q2_b at its gate 328. A third CMOS pair 330 has a PMOS transistor 332 coupled to receive a control signal q3 at its gate 334, and a NMOS transistor 336 coupled to receive the inverted control signal q3_b at its gate 338. A fourth CMOS pair 340 has a PMOS transistor 342 coupled to receive a control signal q4 at its gate 344, and a NMOS transistor 346 coupled to receive the inverted control signal q4_b at its gate 348.

The multiplexer stage 302 also comprises complementary metal oxide semiconductor (CMOS) gates comprising the source of a P-channel transistor coupled to the drain of the N-channel transistor and the drain of the P-channel transistor coupled to the source of the N-channel transistor, where the gates of the P-channel transistors are controlled by data values (shown here as $q_5$-$q_8$) and gates of the N-channel transistors are controlled by inverted data values (shown here as q5_b-q8_b). A first CMOS pair 350 of the multiplexer 302 has a PMOS transistor 352 coupled to receive a control signal q5 at its gate 354, and a NMOS transistor 356 coupled to receive the inverted control signal q5_b at its gate 358. A second CMOS pair 360 has a PMOS transistor 362 coupled to receive a control signal q6 at its gate 364, and a NMOS transistor 366 coupled to receive the inverted control signal q6_b at its gate 368. A third CMOS pair 370 has a PMOS transistor 372 coupled to receive a control signal q7 at its gate 374, and a NMOS transistor 376 coupled to receive the inverted control signal q7_b at its gate 378. A fourth CMOS pair 380 has a PMOS transistor 382 coupled to receive a control signal q8 at its gate 384, and a NMOS transistor 386 coupled to receive the inverted control signal q8_b at its gate 388. Additional pull-down transistors 392-394 are coupled to the node 390 at the input of the inverter 304 to define the state of the inverter if the inputs to the pass gates 350, 360, 370, and 380 are off. Finally, a control circuit 396, which may comprise a pull-down transistor for example, is coupled to the input node 390, where an output signal (out) is generated at the output node 397.

The pull-down transistor of the control circuit 396 will pull the input to the output inverter 304 to a logic LOW state, forcing the output of the inverter 304 to a logic HIGH state. Because each of the pass gates 350, 360, and 370 will be coupled to an output of the output inverter of another stage, all of the inputs to a multiplexer stage will be the same, thereby eliminating contention in the multiplexer. Further, the pass gate 380 will be coupled to an output of an output inverter of another stage by way of one of the pass gates 310, 320, 330, and 340 and the output inverter 308. Accordingly, if the inputs to the output inverter of multiplexer circuits, such as the second multiplexer stage 306, is pulled LOW, the output of the output inverter will be HIGH, resulting in all of the inputs to the pass gates having the same potential, and therefore eliminating contention in the multiplexer.

Transistors 398 and 399 are coupled to receive the GHIGH2_B global control signal at their gates to reduce floating node at an internal node multiplexer stage output. In the case that all memory cells are "OFF" in the internal multiplexer stage, then the pull-down NMOS stack will ensure that the internal multiplexer stage output is driven "LOW".

Accordingly, the use of the control circuit 396, and the arrangement of multiplexer stages in a circuit, reduce contention in an interconnect structure. In particular, the memory cells (generating the control signals q1-q8 and inverted control signals q1_b-q8_b), which control pass gates for programmable resources, need to power-up to a predictable state so that both inputs and outputs of multiplexers that they control are at the same voltage state to reduce contention currents in the interconnect devices. The circuit arrangement of FIG. 3 enables, upon chip power-up, forcing complimentary outputs of all memory cells to logic LOW state, forcing the last stage interconnect inverter input to a logic LOW state, and forcing inputs of all interconnect multiplexers to a logic HIGH state. In order to force complimentary outputs of all memory cells to logic LOW state, it is necessary to drive both outputs of the memory cell to "LOW" state as will be described in more detail below, since the on-chip regulated memory cell VDD supply (VGG) is at a GND state during power-up. As will be described in reference to FIGS. 4-8 controlling inputs of multiplexers using global signals will place the CMOS interconnect in predictable intended state and avoid any contention currents. That is, all multiplexer inputs are pulled to logic HIGH using global signal control during a power-up sequence, and both complementary outputs of memory cell are forced to logic LOW for predictable state during power ramp-up to reduce contention currents.

Figure 4:
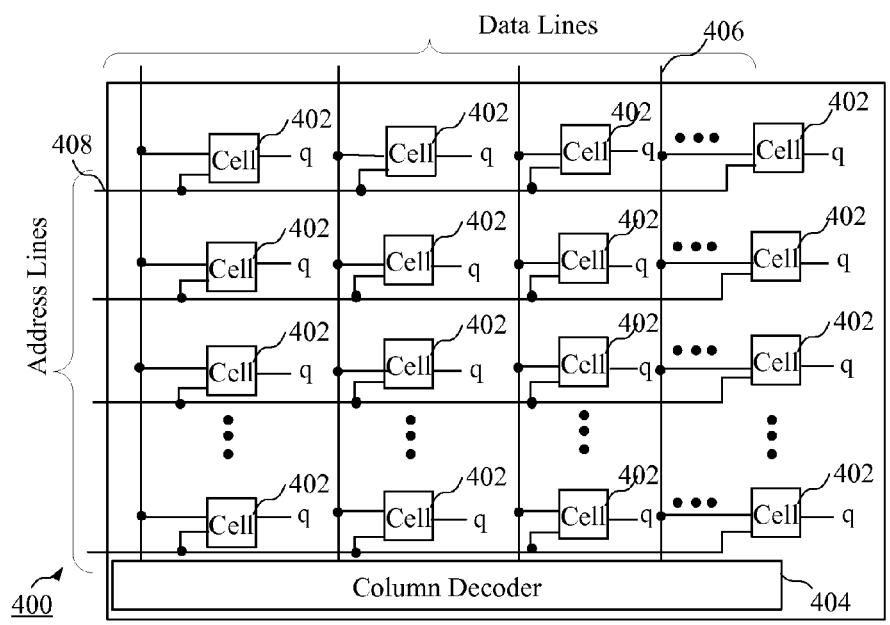
FIG. 4 is a block diagram of an array of memory cells coupled to control the interconnect multiplexer.

Turning now to FIG. 4, a block diagram of an array of memory cells, which may be an SRAM cell for example, coupled to control the interconnect multiplexer is shown. The memory block 400 of FIG. 4 may be a portion of the configuration resources 116 or the internal memory 118. The memory block 400 comprises a plurality of individual memory cells 402, which may be arranged in a matrix. Columns of memory cells and a column decoder 404 are coupled to data lines 406 and rows of memory cells are coupled to address lines 408 to generate output data as an output of the memory block. Accordingly, to write data to a cell, an address line associated with the cell is pulled HIGH, and the desired data is coupled to the data line associated with the cell. As will be described in more detail below, an inverted data value d_b (and therefore the stored value q_b) may be pulled HIGH at a particular time to enable control of the multiplexer. To read data from a cell, the address line associated with a cell is pulled HIGH, and the column decoder generates output values associated with the column in which the cell is located. This is accomplished by setting address lines to logic HIGH while data lines (d and d_b) are held at logic LOW. Initial conditions on critical internal nodes are forced using global signals during power-up. After power-up, the interconnect is released to normal state.

Figure 5:
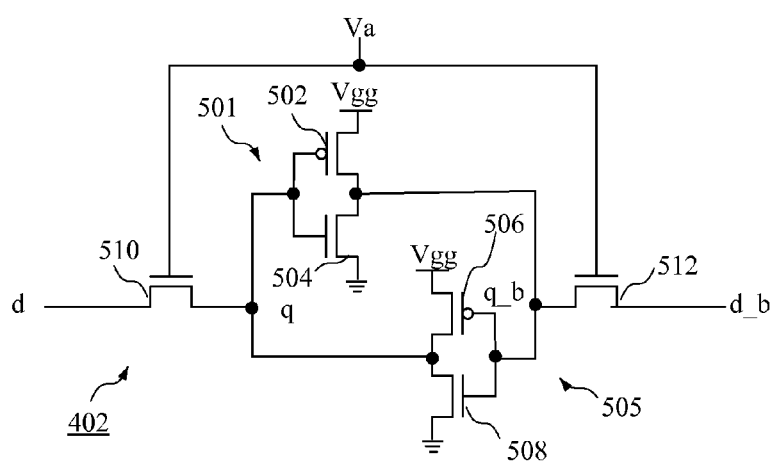
FIG. 5 is circuit diagram of a memory cell of the array of memory cells of FIG. 4.

Turning now to FIG. 5, a circuit diagram of a memory cell of the array of memory cells of FIG. 4 is shown. The memory cell includes an inverter 501 having a p-channel transistor 502 with a source coupled to a reference power voltage, such as Vgg, and a drain coupled at a first node "q_b" to a drain of an n-channel transistor 504, the source of which is coupled to a ground potential (Vss). The memory cell includes a second inverter 505 having a p-channel transistor 506 with a source coupled to the reference voltage and a drain coupled at a second node "q" to a drain of an n-channel transistor 508, the source of which is also coupled to ground. The second node "q" is controlled by an n-channel transistor 510 coupled to receive an address line signal Va at its gate that controls the receipt of input data d on a data line at the first node. The first node "q_b" is controlled by another n-channel transistor 512 coupled to receive the address line signal at its gate that controls the receipt of inverted input data (d_b) at the second node q_b. While the memory cell of FIG. 3 is shown by way of example, other memory cells could be employed.

Figure 6:
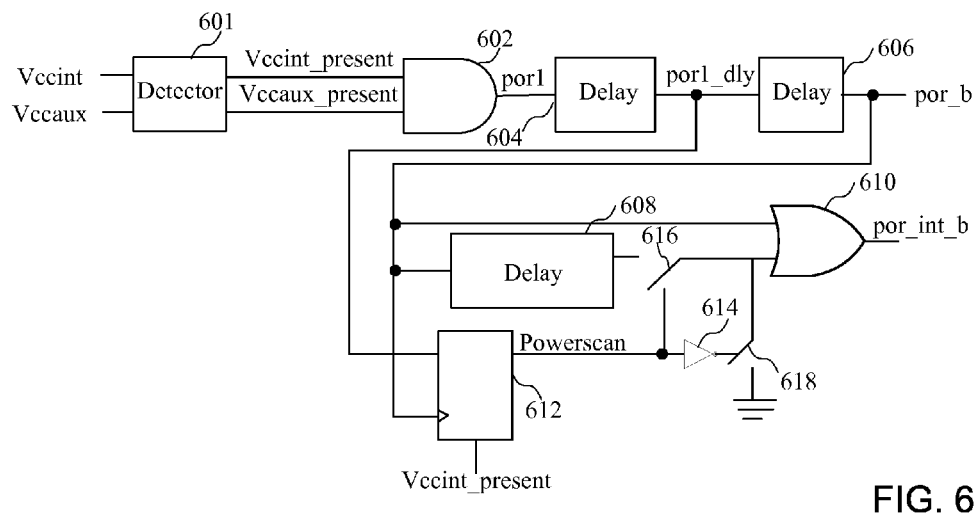
FIG. 6 is a block diagram of a circuit for generating a signal that controls a multiplexer stage of the interconnect multiplexer of FIG. 2.

Turning now to FIG. 6, a block diagram of a circuit for generating a signal that controls a multiplexer circuit of the interconnect multiplexer of FIG. 2 is shown. In particular, a detector 601 is coupled to receive the two power signals Vccint and Vccaux, the outputs (Vccint_present and Vccaux_present) of which indicates whether the particular power signal is present. An AND gate 602 is coupled to receive the Vccint_present and Vccaux_present signals and generates a power-on reset control signal por1 when both signals are present. A delayed power-on reset signal (por1_dly) is generated at the output of the delay 604. Output of delay elements 606 and 608 are coupled to an OR gate 610 to generate the por_int_b signal, in response to the powerscan signal generated in by the register 612. An inverter 614 enables coupling the output of the delay element 608 to an input of the OR gate 610 by way of switches 616 and 618, such that por_int_b signal will be generated (after the powerscan signal is pulled HIGH) when the por_b signal goes LOW.

Figure 7:
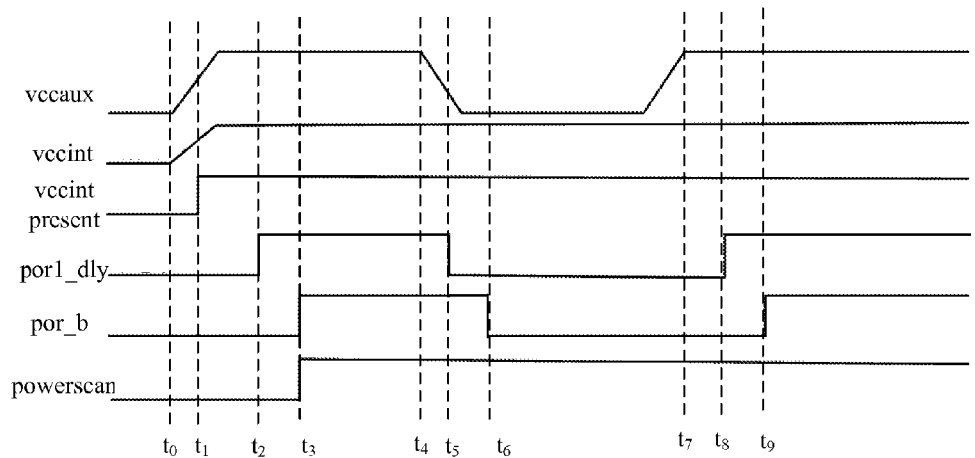
FIG. 7 is a timing diagram showing the generation of the signals used to control the circuit of FIG. 6.
Figure 8:
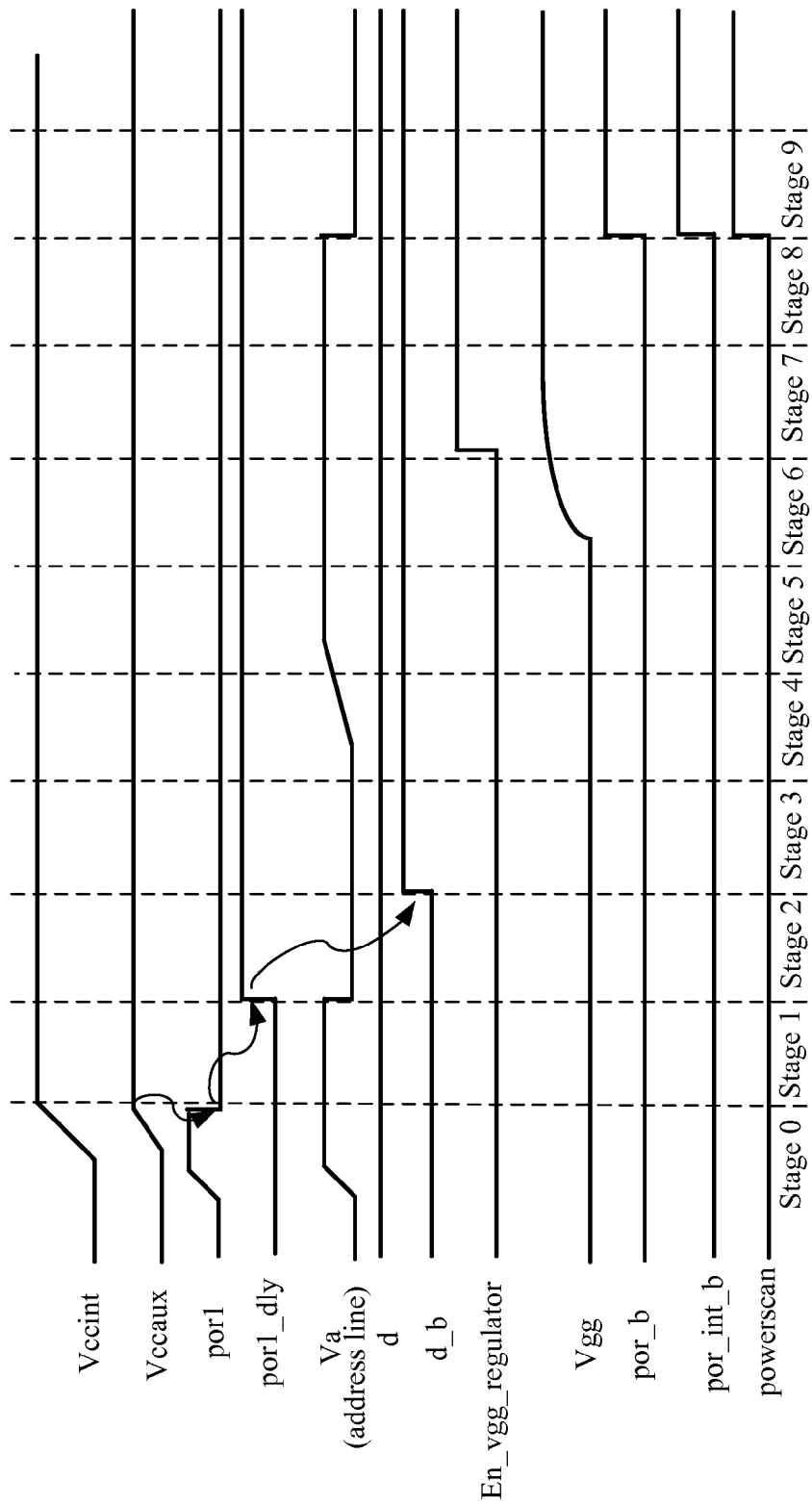
FIG. 8 is a timing diagram showing additional signals generated during the period $t_0$-$t_3$ of FIG. 7 that enable the control of memory elements.

Turning now to FIG. 7, the operation of the circuit of FIG. 6 is shown, where more detail related to the generation of the control signals generated until the powerscan signal is generated at the time $t_3$ is provided in FIG. 8. After the reference voltage signals Vccaux and Vccint start to rise upon power up at a time $t_0$, a "vccpresent" signal is generated at a time $t_1$, leading to "por1_dly" signal at a time $t_2$. The vccpresent signal can be generated using detector 601 for example. The por_b and the powerscan signals are generated at a time $t_3$. After the Vccaux signal starts to go LOW at a time $t_4$, the por_dly will go LOW at a time $t_5$, and the por_b signals go LOW at a time $t_6$. After the Vccaux goes HIGH at a time $t_7$, the por_dly will go HIGH at a time $t_8$, and the por_b signal will go HIGH at a time $t_9$.

Turning now to FIG. 8, more detail is provided for the time period between $t_0$ and $t_3$ of FIG. 7, and more particularly the generation of the por_int_b signal that is used to drive the input of an output inverter of a multiplexer stage to a low voltage, enabling the inputs to the CMOS pass gates to all be at the same voltage, as set forth above. After the Vccaux and Vccint signals start to rise at time $t_0$, the por1 signal is pulled LOW at a stage 1, and por1_dly lines are pulled HIGH at a stage 2. That is, the address lines of memory cells are pulled HIGH and the d_b signal is pulled LOW to make the q and q_b values of memory cell 0V and avoid being struck at unknown value. That is, q and q_b can be struck at a VTP value if the address is LOW initially as there will be no path for q and q_b to discharge. Accordingly, address line and d_b need to be made HIGH to make q_b of the memory cell of FIG. 5 (that controls gates of a CMOS pass gate) follow Vgg when Vgg starts ramping up.

But making d_b HIGH when the address line is HIGH can cause contention in memory cell. To avoid this contention, the address line is pulled LOW in stage 2 and the d_b signal is pulled HIGH in stage 3. The address line starts to rise during a stage 4, and is pulled HIGH during a stage 5. After Vgg starts to rise during a stage 6, an en_vgg_regulator signal is pulled HIGH at the beginning of a stage 7 to enable the regulation of a Vgg voltage. After the address line is pulled low at the end of a stage 8, the por_b, por_int_b and powerscan signals are pulled HIGH during a stage 9. That is, the powerscan goes HIGH after a power-up sequence is completed, and remains HIGH while Vccint remains on the chip. Powerscan is preferably not a global signal, but is a configuration block internal signal. The por_int_b is the same as por_b during power-up, but will be a delayed version of por_b when Vccint supply remains on and Vccaux powers-down. The por_int_b is equivalent to the por_b signal for the interconnect and pulls-down the input of an output inverter in multiplexer. The delay in por_int_b with respect to por_b will ensure that all the inputs to multiplexer stages will be in intended state before the input of an output inverter is pulled LOW by por_int_b.

Figure 9:
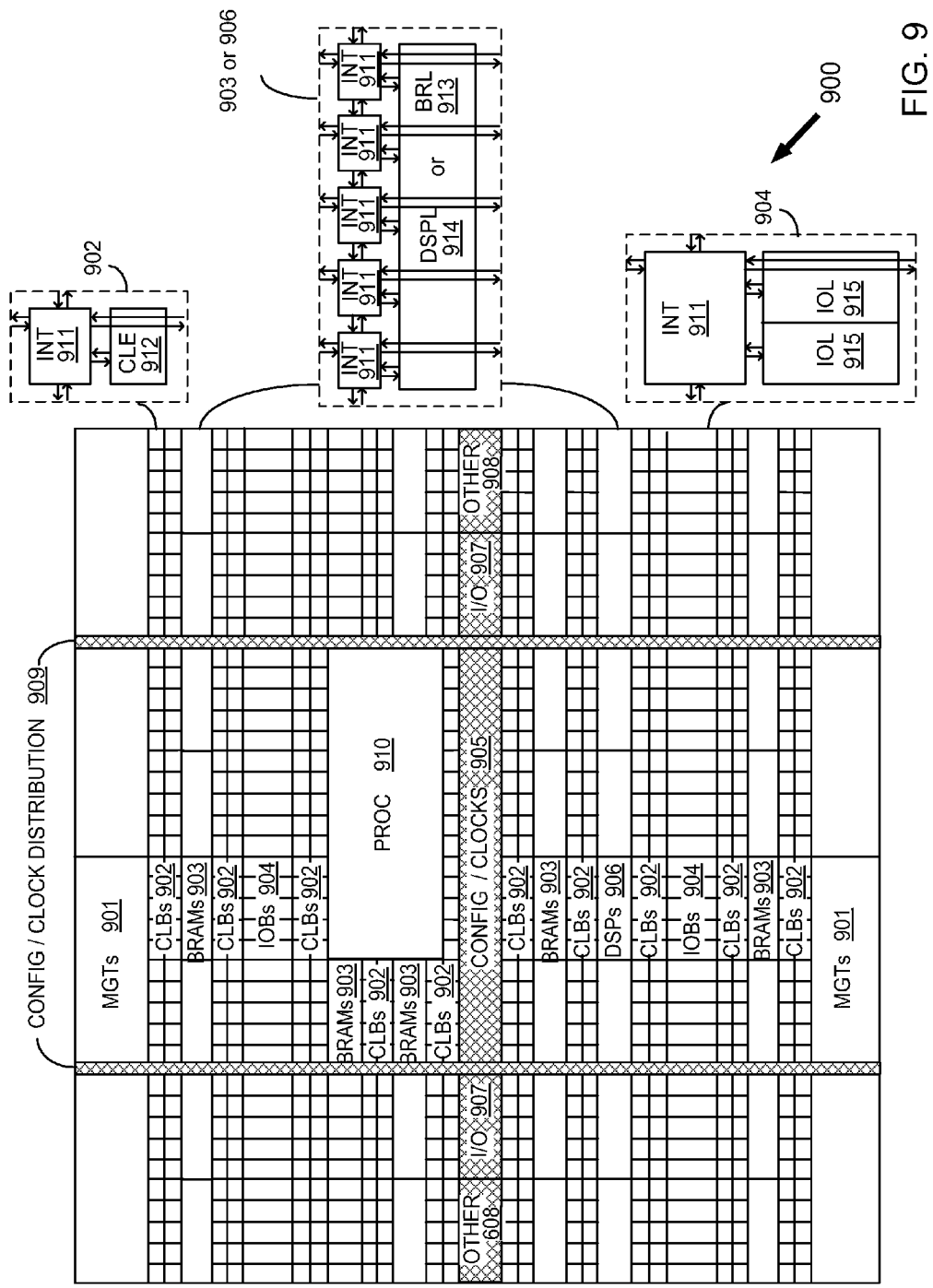
FIG. 9 is a block diagram of a device having programmable resources that may implement the circuits of FIGS. 1-8.

Turning now to FIG. 9, a block diagram of a device having programmable resources including the circuits as implemented in FIGS. 2-8 is shown. While devices having programmable resources may be implemented in any type of integrated circuit device, such as an application specific integrated circuit (ASIC) having programmable resources, other devices comprise dedicated programmable logic devices (PLDs). One type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA. For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., Flash memory, as in some CPLDs), or in any other type of memory cell.

The device of FIG. 9 comprises an FPGA architecture 900 having a large number of different programmable tiles including multi-gigabit transceivers (MGTs) 901, CLBs 902, random access memory blocks (BRAMs) 903, input/output blocks (IOBs) 904, configuration and clocking logic (CONFIG/CLOCKS) 905, digital signal processing blocks (DSPs) 906, specialized input/output blocks (I/O) 907 (e.g., configuration ports and clock ports), and other programmable logic 908 such as digital clock managers, analog-to-digital converters, system monitoring logic, and so forth. Some FPGAs also include dedicated processor blocks (PROC) 910, which may be used to implement a software application, for example.

In some FPGAs, each programmable tile includes a programmable interconnect element (INT) 911 having standardized connections to and from a corresponding interconnect element in each adjacent tile. Therefore, the programmable interconnect elements taken together implement the programmable interconnect structure for the illustrated FPGA. The programmable interconnect element 911 also includes the connections to and from the programmable logic element within the same tile, as shown by the examples included at the top of FIG. 9.

For example, a CLB 902 may include a configurable logic element (CLE) 912 that may be programmed to implement user logic plus a single programmable interconnect element 911. A BRAM 903 may include a BRAM logic element (BRL) 913 in addition to one or more programmable interconnect elements. The BRAM includes dedicated memory separate from the distributed RAM of a configuration logic block. Typically, the number of interconnect elements included in a tile depends on the height of the tile. In the pictured example, a BRAM tile has the same height as five CLBs, but other numbers may also be used. A DSP tile 906 may include a DSP logic element (DSPL) 914 in addition to an appropriate number of programmable interconnect elements. An 10B 904 may include, for example, two instances of an input/output logic element (IOL) 915 in addition to one instance of the programmable interconnect element 911. The location of connections of the device is controlled by configuration data bits of a configuration bitstream provided to the device for that purpose. The programmable interconnects, in response to bits of a configuration bitstream, enable connections comprising interconnect lines to be used to couple the various signals to the circuits implemented in programmable logic, or other circuits such as BRAMs or the processor.

In the pictured example, a columnar area near the center of the die is used for configuration, clock, and other control logic. The config/clock distribution regions 909 extending from this column are used to distribute the clocks and configuration signals across the breadth of the FPGA. Some FPGAs utilizing the architecture illustrated in FIG. 9 include additional logic blocks that disrupt the regular columnar structure making up a large part of the FPGA. The additional logic blocks may be programmable blocks and/or dedicated logic. For example, the processor block PROC 910 shown in FIG. 9 spans several columns of CLBs and BRAMs.

Note that FIG. 9 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 9 are purely exemplary. For example, in an actual FPGA more than one adjacent column of CLBs is typically included wherever the CLBs appear in order to facilitate the efficient implementation of user logic. While FIG. 9 relates to an integrated circuit having programmable resources, it should be understood that the circuits and methods set forth in more detail below could be implemented in any type of ASIC.

Figure 10:
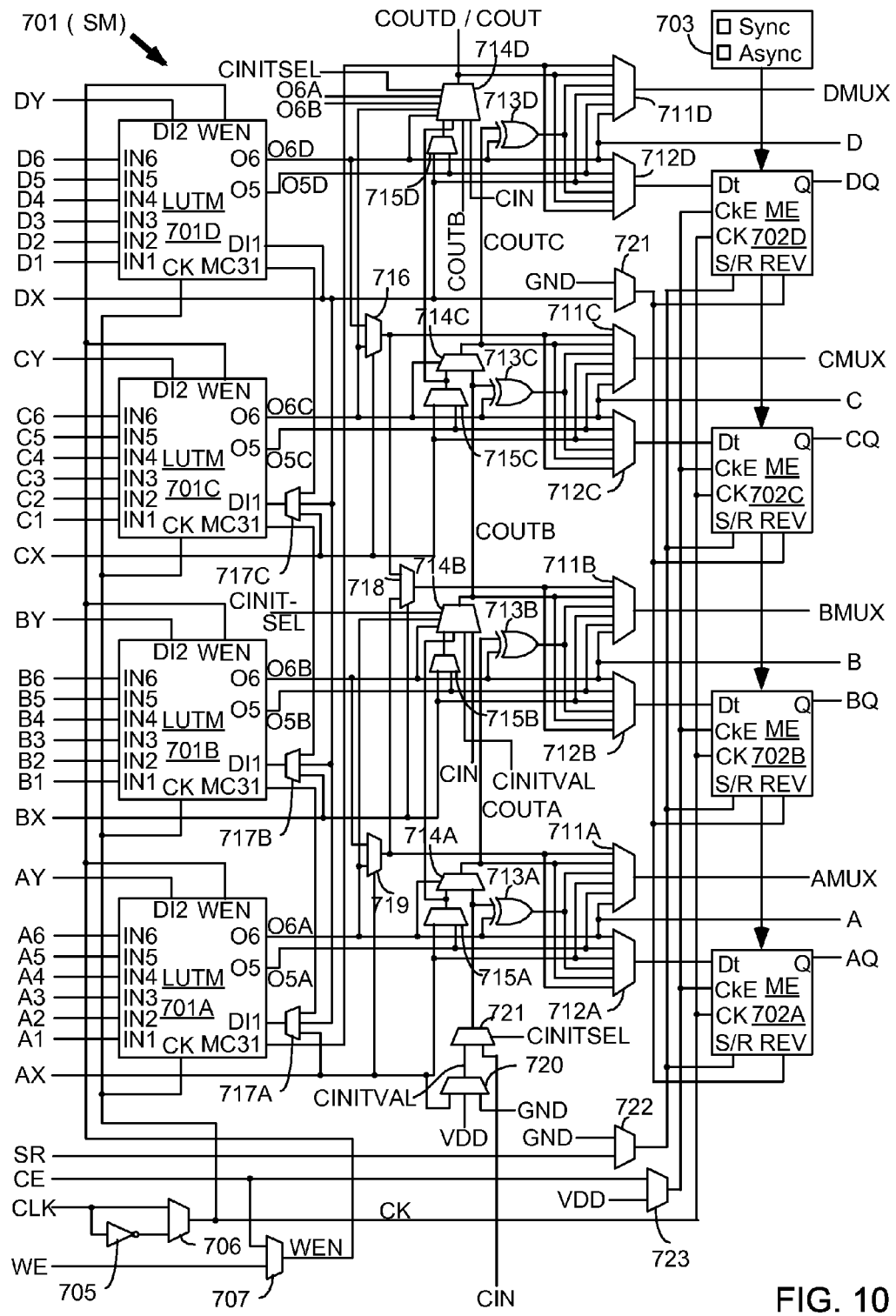
FIG. 10 is a block diagram of a configurable logic element of the device of FIG. 9.

Turning now to FIG. 10, block diagram of a configurable logic element of the device of FIG. 9 is shown. In particular, FIG. 10 illustrates in simplified form a configurable logic element of a configuration logic block 902 of FIG. 9. In the circuit of FIG. 10, slice M 1001 includes four lookup tables (LUTMs) 1001A-1001D, each driven by six LUT data input terminals A1-A6, B1-B6, C1-C6, and D1-D6 and each providing two LUT output signals O5 and O6. The O6 output terminals from LUTs 1001A-1001D drive slice output terminals A-D, respectively. The LUT data input signals are supplied by the FPGA interconnect structure via input multiplexers, which may be implemented by programmable interconnect element 1011, and the LUT output signals are also supplied to the interconnect structure. Slice M also includes: output select multiplexers 1011A-1011D driving output terminals AMUX-DMUX; multiplexers 1012A-1012D driving the data input terminals of memory elements 1002A-1002D; combinational multiplexers 1816, 1018, and 1019; bounce multiplexer circuits 1022-1023; a circuit represented by inverter 1005 and multiplexer 1006 (that together provide an optional inversion on the input clock path); and carry logic having multiplexers 1014A-1014D, 1015A-1015D, 1020-1021 and exclusive OR gates 1013A-1013D. All of these elements are coupled together as shown in FIG. 10. Where select inputs are not shown for the multiplexers illustrated in FIG. 10, the select inputs are controlled by configuration memory cells. That is, configuration bits of the configuration bitstream stored in configuration memory cells are coupled to the select inputs of the multiplexers to select the correct inputs to the multiplexers. These configuration memory cells, which are well known, are omitted from FIG. 10 for clarity, as well as from other selected figures herein.

In the pictured example, each memory element 1002A-1002D may be programmed to function as a synchronous or asynchronous flip-flop or latch. The selection between synchronous and asynchronous functionality is made for all four memory elements in a slice by programming Sync/Asynch selection circuit 1003. When a memory element is programmed so that the S/R (set/reset) input signal provides a set function, the REV input terminal provides the reset function. When the memory element is programmed so that the S/R input signal provides a reset function, the REV input terminal provides the set function. Memory elements 1002A-1002D are clocked by a clock signal CK, which may be provided by a global clock network or by the interconnect structure, for example. Such programmable memory elements are well known in the art of FPGA design. Each memory element 1002A-1002D provides a registered output signal AQ-DQ to the interconnect structure. Because each LUT 1001A-1001D provides two output signals, O5 and O6, the LUT may be configured to function as two 5-input LUTs with five shared input signals (IN1-IN5), or as one 6-input LUT having input signals IN1-IN6.

In the circuit of FIG. 10, each LUTM 1001A-1001D may function in any of several modes. When in lookup table mode, each LUT has six data input signals IN1-IN6 that are supplied by the FPGA interconnect structure via input multiplexers. One of 64 values is programmably selected from configuration memory cells based on the values of signals IN1-IN6. When in RAM mode, each LUT functions as a single 64-bit RAM or two 32-bit RAMs with shared addressing. The RAM write data is supplied to the 64-bit RAM via input terminal DI1 (via multiplexers 1017A-1017C for LUTs 1001A-1001C), or to the two 32-bit RAMs via input terminals DI1 and DI2. RAM write operations in the LUT RAMs are controlled by clock signal CK from multiplexer 1006 and by write enable signal WEN from multiplexer 1007, which may selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals may be provided through the LUT output terminals, and the 32-bit shift out signal may also be provided more directly via LUT output terminal MC31. The 32-bit shift out signal MC31 of LUT 1001A may also be provided to the general interconnect structure for shift register chaining, via output select multiplexer 1011D and CLE output terminal DMUX. Accordingly, the circuits and methods set forth above may be implemented in a device such as the devices of FIGS. 9 and 10, or any other suitable device.

Figure 11:
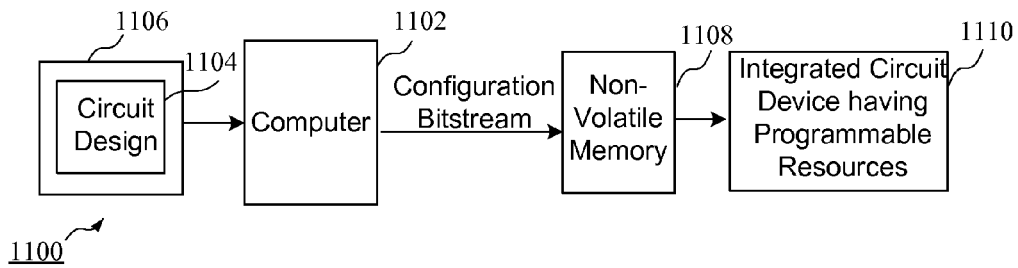
FIG. 11 is a block diagram of a system for programming a device having programmable resources.

Turning now to FIG. 11, a block diagram of an exemplary system for programming a device having programmable resources is shown. In particular, a computer 1102 is coupled to receive a circuit design 1104 from a memory 1106, and generate a configuration bitstream that is stored in the non-volatile memory 1106. As will be described in more detail below, the circuit design may be a high level design, such as a circuit design defined in a hardware description language (HDL). Also, the computer may be configured to run software that generates a configuration bitstream that is stored in the non-volatile memory 1108 and provided to an integrated circuit 1110 that may be a programmable integrated circuit, such as the integrated circuit described above in FIGS. 9 and 10.

Figure 12:
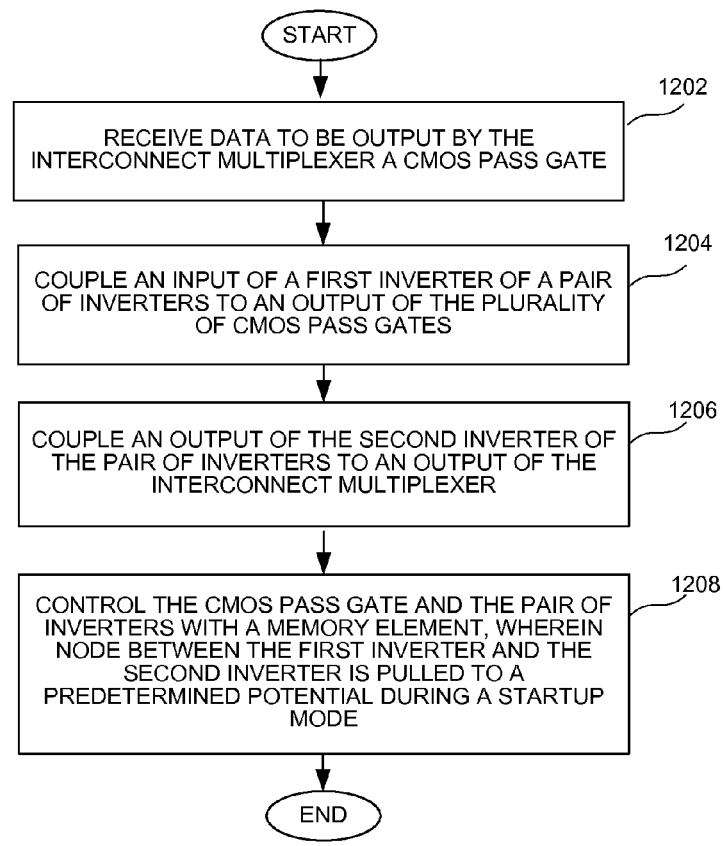
FIG. 12 is a flow chart showing a method of reducing contention currents in an interconnect multiplexer in an integrated circuit device.

Turning now to FIG. 12, a flow chart shows a method of reducing contention currents in an integrated circuit device. In particular, data to be output by the interconnect multiplexer a CMOS pass gate is received at a step 1202. An input of a first inverter of a pair of inverters is coupled to an output of the plurality of CMOS pass gates at a step 1204. An output of the second inverter of the pair of inverters is coupled to an output of the interconnect multiplexer at a step 1206. The CMOS pass gate and the pair of inverters are controlled with a memory element, wherein node between the first inverter and the second inverter is pulled to a predetermined potential during a startup mode at a step 1208. While specific elements of the method are described, it should be understood that additional elements of the method, or additional details related to the elements 2002-2008, could be implemented according to the disclosure of FIGS. 1-11.

It can therefore be appreciated that an interconnect multiplexer and methods of reducing contention currents in an integrated circuit device have been described. It will be appreciated by those skilled in the art that numerous alternatives and equivalents will be seen to exist that incorporate the disclosed invention. As a result, the invention is not to be limited by the foregoing examples, but only by the following claims.

What is claimed is:

1. An interconnect multiplexer, comprising:
   a plurality of CMOS pass gates of a first multiplexer stage coupled to receive data to be output by the interconnect multiplexer;
   an output inverter having an input coupled to outputs of the plurality of CMOS pass gates, wherein an output of the output inverter is an output of the interconnect multiplexer; and
   a plurality of memory elements coupled to the plurality of CMOS pass gates;
   wherein inputs to the plurality of CMOS pass gates are pulled to a common potential during a startup mode; and
   wherein address lines of the plurality of memory elements are pulled to a first predetermined potential and data lines of the plurality of memory elements are pulled to a second predetermined potential using global signals during a power-up sequence.

2. The interconnect multiplexer of claim 1, further comprising a control circuit coupled to a node at an input of the output inverter, wherein the control circuit pulls the node to a predetermined potential during the startup mode.

3. The interconnect multiplexer of claim 2, wherein the interconnect multiplexer further comprises a plurality of multiplexer stages, wherein each multiplexer stage of the plurality of multiplexer stages is coupled to an output inverter.

4. The interconnect multiplexer of claim 3, wherein each input of a CMOS pass gate of the plurality of CMOS pass gates is coupled to an output of an output inverter of another multiplexer stage.

5. The interconnect multiplexer of claim 1, wherein, for each CMOS pass gate of the first multiplexer stage:
   an output of the memory element is coupled to a gate of an NMOS transistor of a corresponding CMOS pass gate; and
   an inverted output of the memory element that is pulled to the second predetermined potential is coupled to a gate of a PMOS transistor of the corresponding CMOS pass gate.

6. An interconnect multiplexer, comprising:
   a plurality of multiplexer stages;
   a plurality of CMOS pass gates of a first multiplexer stage of the plurality of multiplexer stages coupled to receive a corresponding plurality of inputs;
   a first output inverter having an input coupled to outputs of the plurality of CMOS pass gates of the first multiplexer stage; and
   a control circuit coupled to a node at the input of the first output inverter of the first multiplexer stage, wherein the node is pulled to a predetermined potential during a startup mode;
   wherein the plurality of CMOS pass gates are controlled by a plurality of memory elements; and
   wherein address lines of the plurality of memory elements are pulled to a first predetermined potential and data lines of the plurality of memory elements are pulled to a second predetermined potential using global signals during a power-up sequence.

7. The interconnect multiplexer of claim 6, wherein an input of a CMOS pass gate of another multiplexer stage of the plurality of multiplexer stages is coupled to an output of the first output inverter.

8. The interconnect multiplexer of claim 6, wherein inputs to the plurality of CMOS pass gates of the first multiplexer stage are pulled to a common potential during the startup mode.

9. The interconnect multiplexer of claim 6, wherein, for each CMOS pass gate of the first multiplexer stage:
   an output of the memory element is coupled to a gate of an NMOS transistor of a corresponding CMOS pass gate; and
   an inverted output of the memory element that is pulled to the second predetermined potential is coupled to a gate of a PMOS transistor of the corresponding CMOS pass gate.

10. The interconnect multiplexer of claim 6, further comprising a second output inverter coupled between a second multiplexer stage of the plurality of multiplexer stages and an input to a CMOS pass gate of the first multiplexer stage.

11. A method of reducing contention currents in an interconnect multiplexer of an integrated circuit, the method comprising:
    implementing a plurality of CMOS pass gates of a first multiplexer stage to output data;
    coupling an input of an output inverter to outputs of the plurality of CMOS pass gates;
    coupling a plurality of memory elements to the plurality of CMOS pass gates; wherein the plurality of CMOS pass gates are controlled by the plurality of memory elements;
    pulling inputs to the plurality of CMOS pass gates to a common potential during a startup mode; and
    pulling address lines of the plurality of memory elements to a first predetermined potential and pulling data lines of the plurality of memory elements to a second predetermined potential using global signals during a power-up sequence.

12. The method of claim 11, further comprising pulling an input of the output inverter to a predetermined potential during the startup mode.

13. The method of claim 11, further comprising, for each CMOS pass gate of the first multiplexer stage:
    coupling an output of the memory element to a gate of an NMOS transistor of a corresponding CMOS pass gate; and
    coupling an inverted output of the memory element that is pulled to the second predetermined potential to a gate of a PMOS transistor of the corresponding CMOS pass gate.

14. The method of claim 11, further comprising coupling a second output inverter between a second multiplexer stage of the plurality of multiplexer stages and an input to a CMOS pass gate of the first multiplexer stage.

* * * * *